United States Patent [19]

Kagatsume et al.

[11] Patent Number: 4,908,095
[45] Date of Patent: Mar. 13, 1990

[54] ETCHING DEVICE, AND ETCHING METHOD

[75] Inventors: Satoshi Kagatsume, Nirasaki; Kazuo Fukasawa, Kofu, both of Japan

[73] Assignee: Tokyo Electron Limited, Tokyo, Japan

[21] Appl. No.: 344,709

[22] Filed: Apr. 28, 1989

[30] Foreign Application Priority Data

May 2, 1988 [JP] Japan .................. 63-109789

[51] Int. Cl.$^4$ .............. B44C 1/22; C03C 15/00; C03C 25/06; H01L 21/306
[52] U.S. Cl. .................. 156/643; 156/345; 204/298
[58] Field of Search .......... 156/345, 643, 646; 204/192.32, 298; 118/50.1, 620, 729; 427/38, 39; 414/217, 222, 225, 411, 416, 422, 744 R

[56] References Cited

U.S. PATENT DOCUMENTS

| | | | |
|---|---|---|---|
| 4,526,670 | 7/1985 | Hajj | 156/345 X |
| 4,661,196 | 4/1987 | Hockersmith et al. | 156/345 |
| 4,816,638 | 3/1989 | Ukai et al. | 156/345 X |
| 4,838,978 | 6/1989 | Sekine et al. | 156/345 |

FOREIGN PATENT DOCUMENTS

63-80535  4/1988  Japan .

Primary Examiner—William A. Powell
Attorney, Agent, or Firm—Oblon, Spivak, McClelland, Maier & Neustadt

[57] ABSTRACT

An etching device comprising a housing in which etching process is carried out, an electrode system having lower and upper electrodes opposed to each other used to generate plasma between these electrodes, while a semiconductor wafer is being placed on the lower electrode, a lifter system to move the lower electrode up and down, a high-frequency power source for applying current between these electrodes, a holder member located between the lower and upper electrodes to hold the wafer at a certain position between these electrodes, and a gas supply means for supplying reaction gases used to generate plasma, between the lower and upper electrodes.

22 Claims, 8 Drawing Sheets

ETCHING DEVICE, AND ETCHING METHOD

BACKGROUND OF THE INVENTION

1. Field of the Invention

The present invention relates to a device and a method of etching an elements such as semiconductor elements or LCD substrate.

2. Description of the Related Art

More and more attention has been paid these days to the plasma etching device which etches various kinds of thin film, using components reacting in gas plasma. This is because this device helps to simplify and automate the complicated process of semiconductor manufacturing elements, and to form micropatterns with high accuracy.

A plasma etching device of this type is disclosed in, for example, Japanese Patent Disclosure No. 57-156034. In this plasma etching device, a lower electrode made of aluminium is located under an air-tight vessel which is set side by side with a vacuum means, and an upper electrode made of amorphous carbon and supported by an electrode body made of, for example, aluminium, is located above and opposite to the lower electrode. The upper and lower electrodes are connected to an RF power source. An object to be processed, for example, a semi-conductor wafer, is placed on the lower electrode. Power is supplied from the RF power source to both electrodes, and process gas is supplied into the gap between the electrodes, while keeping the gap in vacuum. The process gas is forced into plasma by the power supplied, and the surface of the object to be processed is etched by the plasma.

To place the semiconductor wafer on the lower electrode, the upper electrode is lifted to have a certain clearance with respect to the lower electrode. The semiconductor wafer, which has been carried by a carrier means such as the robot hand, is placed on the lower electrode and the upper electrode is then lowered, thus defining a predetermined gap between it and the lower electrode.

In the case of this device, the upper electrode is moved up and down. The system for driving the upper electrode is therefore located above the level at which the wafer is located. This causes dust, generated by this drive system, to adhere to the wafers being carried outside the vacuum atmosphere or those housed in cassettes. The dust on wafers imposes undesirable influence on micropatterns of highly integrated circuits formed on wafers, thereby lowering the efficiency of the etching process.

In order to eliminate this drawback, there has been proposed a device designed to move the lower electrode and to locate the system of driving the lower electrode below that level at which the wafer is placed (see preliminarily-opened Japanese Utility Model Application Sho 56-43158). In the case of this second device, however, the gap between the semiconductor wafer placed on the lower electrode and the upper electrode cannot always be constant. This prevents uniform etching.

A clamp ring for holding a wafer can be located between the upper and lower electrodes, thereby to maintain an uniform gap between the upper electrode and the wafer (see U.S. Pat. No. 4,615,755). The use of such a clamp ring is disadvantageous in two respects. First, since the system for driving the clamp ring is located above the wafer, the dust raised by this system is likely to lie on the wafer. Secondly, the gap formed between the wafer and the upper electrode is not sufficiently uniform.

SUMMARY OF THE INVENTION

The present invention is therefore intended to eliminate the above-mentioned drawbacks. Its object is to provide a device and a method for uniformly etching an object to be etched with a high efficiency.

An etching device comprising: housing in which etching process is carried out; electrode means having first and second electrodes opposed to each other, for generating plasma between these electrodes while an object to be processed is being supported on the first electrode; drive means for driving said first electrode toward said second electrode; power-supplying means for applying a current between the first and second electrodes; holding means located between the first and second electrodes, for holding the object when said first electrode is moved, thereby pushing the object; and gas-supplying means for supplying reaction gases, which serve to etch the object, into a gap between the first and second electrodes.

A method of etching an object held between first and second electrodes, which plasma generated between these electrodes, said method comprising the steps of: supporting the object on said lower electrode; moving said first electrode, thereby to push the object onto a holding member located between said first and second electrodes, whereby the object is held by said holding member; and generating plasma between said first and second electrodes, while supplying reaction gases into a gap between said first and second electrodes, thereby etching the object.

DETAILED DESCRIPTION OF THE PREFERRED EMBODIMENTS

An etching device, which is an embodiments of the present invention, for use in the semiconductor manufacturing process will be described in detail with reference to the accompanying drawings.

Figure 1:
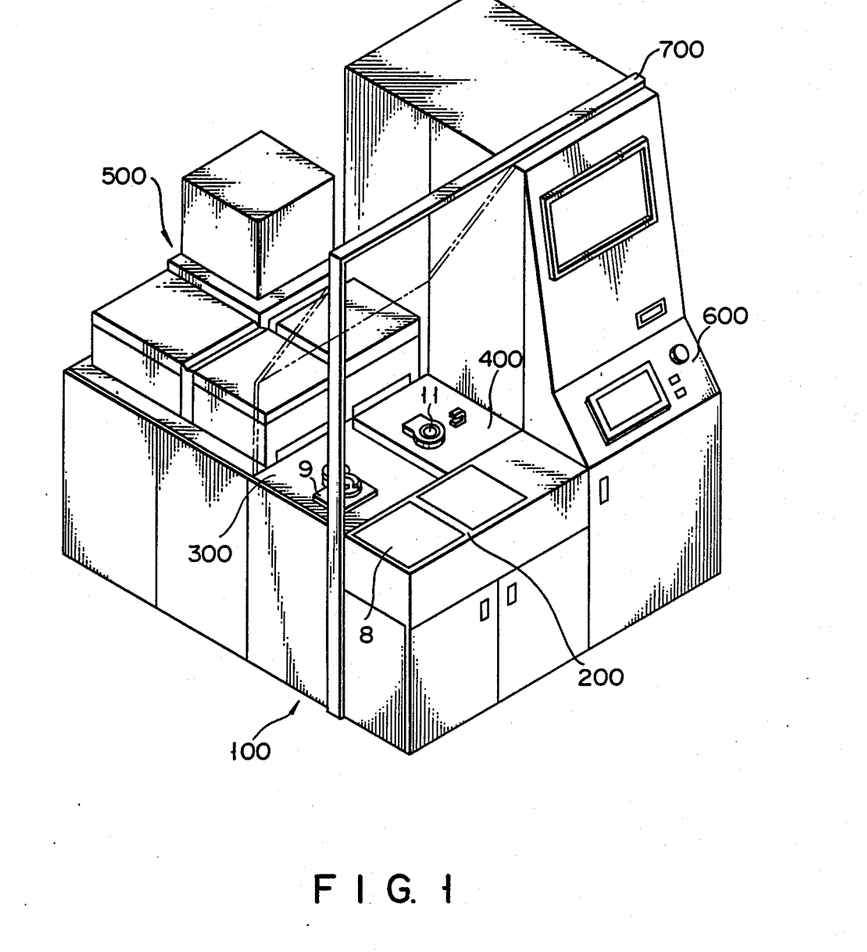
FIG. 1 is a perspective view showing a plasma etcher in which an etching device of the present invention is incorporated.
Figure 2:
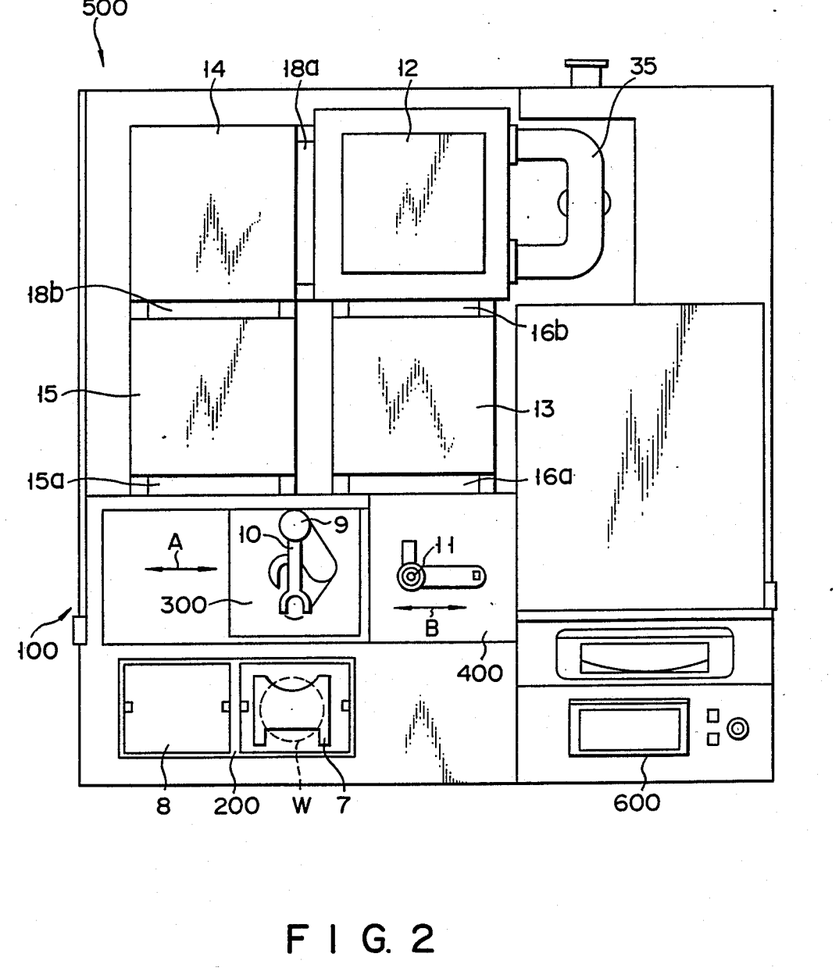
FIG. 2 is a plan showing the etcher.

FIG. 1 is a perspective view showing a plasma etcher according to the present invention. FIG. 2 is a plan showing the plasma etcher. This etcher comprises loader/unloader section 100 having accommodating section 200 for accommodating substrates to be processed or semi-conductor wafers W, carrier section 300 for carrying wafer W into and out of housing section 200, and alignment section 400 for aligning the wafers W carried from carrier section 300, processing section 500 for etching wafers W aligned by alignment section 400, operating section 600 for setting or monitoring the operation of any other section, and partition section 700 for partitioning housing and operating sections 200 and 600 from the other sections.

Units (or two units in FIG. 2) of wafer cassettes 7, in which 25 pieces, for example, of semiconductor wafers are located at certain intervals, can be housed in accommodating section 200. Wafer cassettes 7 accommodated are placed on corresponding cassette stages 8. Each cassette is placed on the cassette stage, holding the wafers horizontally. These cassette stages 8 are moved up and down by lifter systems (not shown), independently of each other. One of the wafer cassettes is used to receive wafers, while the other to deliver wafers. It is preferable that the lifter systems are located always below cassette stages 8 to prevent dust from adhering to the wafers.

Figure 3:
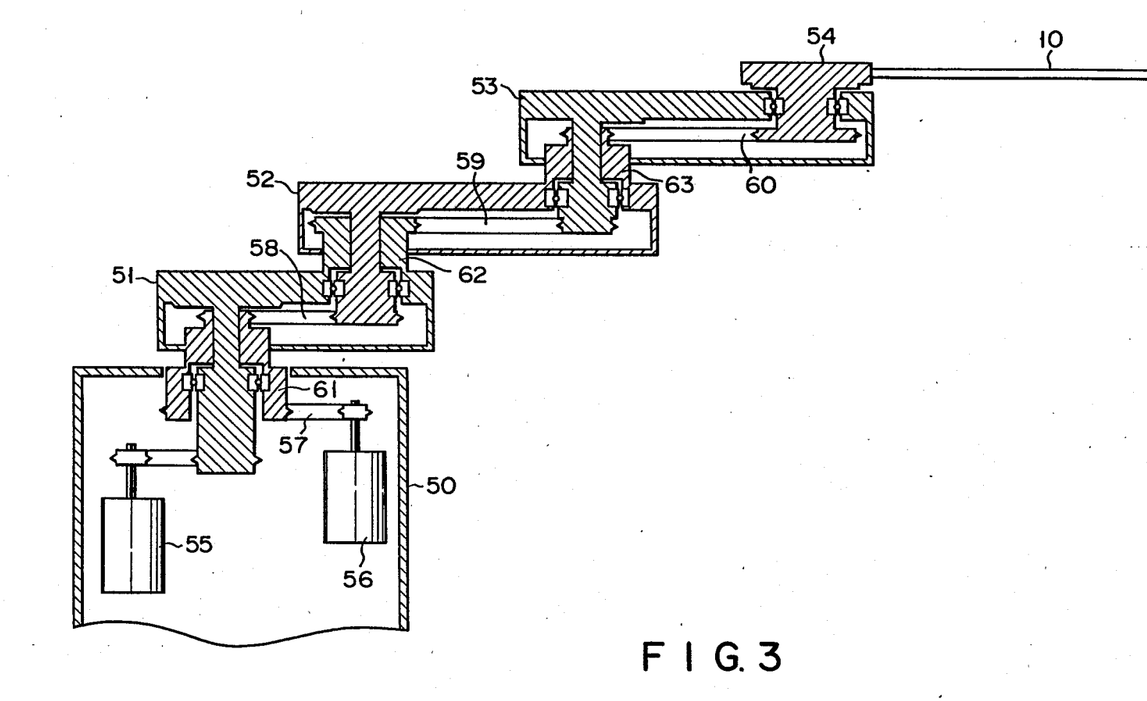
FIG. 3 is a sectional view showing a multi-joints robot for carrying wafers.

Carrier section 300 is provided with multi-joints robot 9 for carrying wafers W from housing section 200 to alignment section 400, as well as from process section 500 to housing section 200. As shown in FIG. 3, robot 9 comprises base 50 in which an arms drive system is housed, first arm 51 connected to base 50, second arm 52 connected to first arm 51, third arm 53 connected to second arm 52, fourth arm 54 connected to third arm 53 and arm 10 connected to fourth arm 54 and provided with a wafer holding system or vacuum suction system (not shown). Arm 10 is made of ceramic or quartz to prevent wafer W from being contaminated with heavy metal. Arms 51, 52, 53 and 54 are rotated relative to one another when driven by motors 55 and 56 through sleeves 61, 62, 63 and belts 57, 58, 59, 60. Base 50 is also rotated and moved horizontally in directions A by a drive system (not shown). Arm 10, on which wafer W is placed, can be thus moved to any desired position.

Alignment section 400, where wafers W are aligned, has vacuum chuck member 11 for holding wafer W at a certain position. Vacuum chuck member 11 includes columnlike inner chuck 11a and ring-shaped outer chuck 11b enclosing inner chuck 11a with a certain gap between them. Inner chuck 11a can rotate around its axis and move up and down, while outer chuck 11b can move horizontally in directions B. Located outside chuck member 11 is a sensor, for example transmission sensor (not shown), movable toward the center of the inner chuck to detect the outer rim of wafer W. Wafer W is aligned to occupy a previously-determined position by inner and outer chucks 11a and 11b responsive to detection signals supplied by this sensor.

Process section 500 is used to etch wafer W positioned at alignment section 400. Section 500 has etching process chamber 12, load lock chambers 13, 14 and auxiliary chamber 15.

Process chamber 12 is used to etch wafer W in a desired atmosphere whose pressure is held low chamber 12 contains an etching system, which will be described later.

Load lock chambers 13 and 14 enable wafer W to be carried therethrough, while holding them air-tight. When wafer W is carried into and out of etching process chamber 12, therefore, any desired atmosphere can be held in process chamber 12. The load lock chambers are disclosed in U.S. Pat. No. 4,433,951, which is incorporated herein by reference. Load lock chamber 13 is located on the entrance portion of process chamber 12. Load lock chamber 14 is located on the exit portion of chamber 12. Load lock chambers 13 and 14 have opening/closing closing systems 16a and 16b, and 18a and 18b, respectively, to carry wafer W into and out of process chamber 12, without adversely influencing the atmosphere within process chamber 12. This opening and closing system can be formed by gate valves. The gate valves are disclosed in U.S. Pat. No. 4,632,624 and No. 4,721,282, which are incorporated herein by reference. Connected to load lock chambers 13 and 14 are an exhaust system, for example rotary pump (not shown), and a purge system (not shown) for introducing an inert gas such as $N_2$ gas into them.

Auxiliary chamber 15 can be used to meet various purposes of applying processing such as light etching or ashing to wafer W after wafer W is etched in etching process chamber 12, and of keeping the pressure between that of load lock and housing chambers 14 and 200. Chamber 15 has opening/closing system 15a on the side of multi-joints robot 9, which are identical in arrangement to the above-mentioned ones 16a, 16b and 18a, 18b. It is also provided with the purge system (not shown) for introducing an inert gas into it, and the exhaust system (not shown). When these purge and exhaust systems are correctly operated, wafer W can be prevented from flying up because of pressure difference between air outside and inside auxiliary chamber 15 upon rendering system 15a open.

Figure 4:
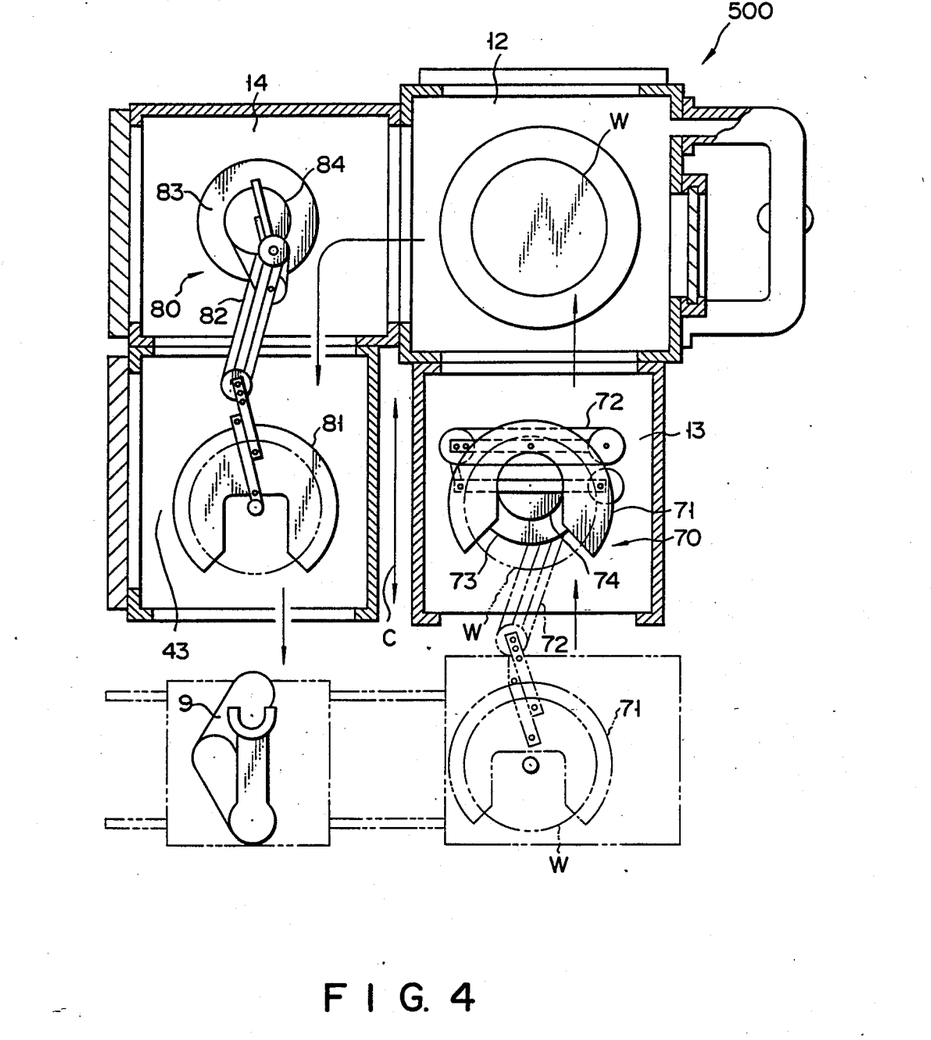
FIG. 4 shows systems for carrying wafers at a process section of the etcher.

As is shown in FIG. 4, wafer W is carried in process section 500 by handling device 70 and 80 which are arranged in load lock chambers 13 and 14, respectively. Handling device 70 includes base 73 rotated by a rotary system (not shown), multi-joint arm 72 for horizontally carrying wafer W in directions C, motor 74 for driving multi-joint arm 72, and wafer holder 71 attached to the foremost end of multi-joint arm 72. By rotating base 73 and moving multi-joint arm 72 linearly, wafer W is carried from alignment section 400 to process chamber 12. Handling device 80 has the same structure as handling means 70; it includes base 83, multi-joint arm 82, motor 84 and wafer holder 81. When base 83 is rotated, while moving multi-joint arm 82 linearly, wafer W is carried from process chamber 12 to housing section 200, passing through auxiliary chamber 15.

Auxiliary chamber 15 has opening closing system 15a on the side of multi-joint robot 9. It also has the purge system (not shown) for introducing an inert gas into it, and an exhaust system (not shown). When these purge and exhaust systems are correctly operated, wafer W remains intact, despite the pressure difference which occurs between air outside and in auxiliary chamber 15 upon making system 15a open.

Figure 8:
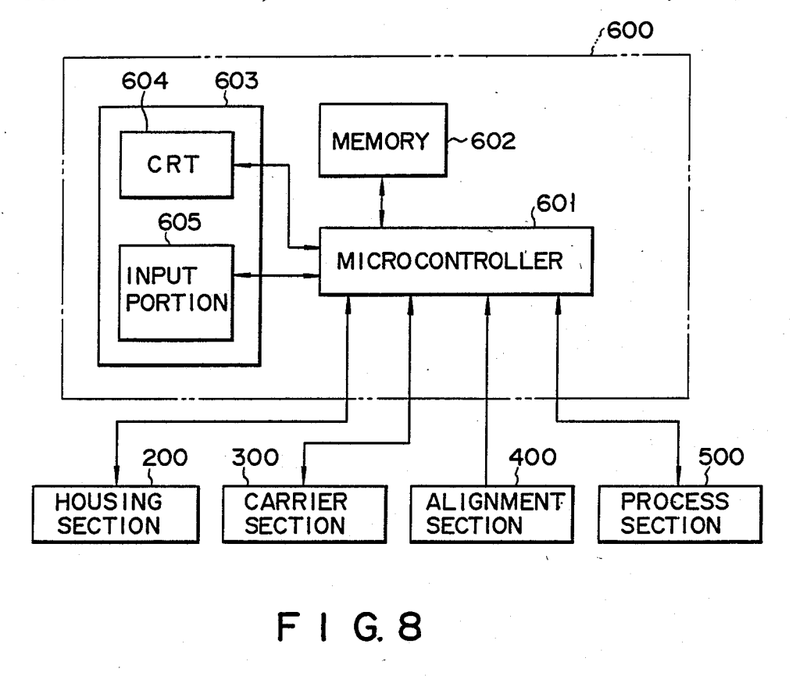
FIG. 8 is a block diagram showing an operation section of the etcher.

Operation section 600 is intended to control the whole of the device, set operation of the device, and monitor or observe the state of wafer W which is being processed. As is shown in FIG. 8, section 600 includes micro-controller 601 for controlling each of the sections, memory 602, and input/output portion 603 having input portion 605 provided with a keyboard and an IC Card insertion slit, and CRT 604 serving as a display.

Partition section 700 partitions accommodating section 200 and operation section 600 from the other sections. Accommodating and operation sections 200 and 600 are located in a clean room which is higher pressurized and cleaned, while the other sections are located in a clean room which is lower pressurized and cleaned, serving as a maintenance room. The etching device is installed under such circumstances as to allow air to flow from the higher cleaned room to the less lower cleaned maintenance room.

Figure 5:
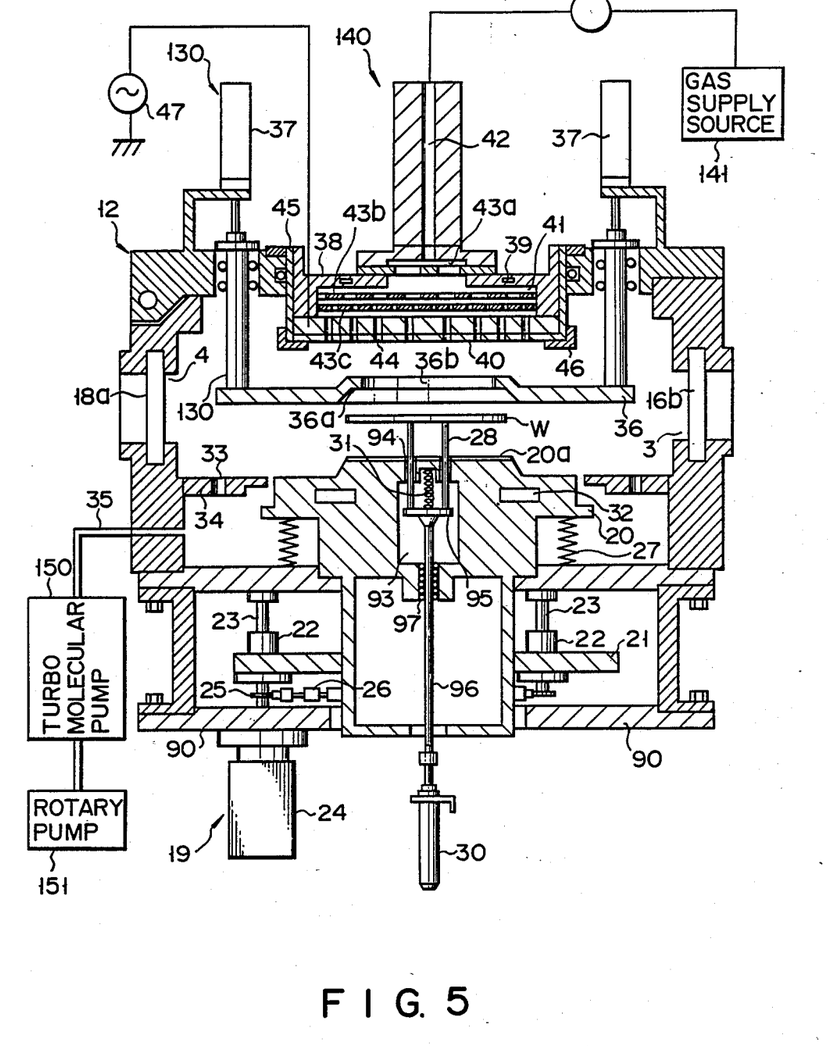
FIG. 5 is a sectional view showing an embodiment of the etching device according to the present invention.

FIG. 5 is a sectional view showing a system for etching wafer W in process chamber 12. This etching process system comprises lower electrode 20 located at the lower portion of process chamber 12, lifter 19 for moving lower electrode 20 up and down. upper electrode 40, support 38 for supporting upper electrode 40, clamp ring 36 for holding wafer W, pressure system 130 for adding push force to clamp ring 36, and system 140 for supplying reaction gas to wafer W.

The wall of process chamber 12 is made of aluminium, and its surface is anodized. Wafer inlet port 3 wafer outlet port 4 are formed in the wall of process chamber 12. These ports are opened and closed by above-described opening and closing systems 16b and 18a.

Column-like lower electrode 20 is made of aluminium, and its surface is anodized. Lower electrode 20 can be moved up and down. The top of lower electrode 20, on which wafer W is placed, is a little bulging like a dome. Therefore, wafer W can be held almost horizontal as soon as it is positioned by the clamp ring as mentioned later. Disk-like support plate 21 is fixed to the lower portion of lower electrode 20. Synthetic macromolecule film or heat-resistant rein film 20a of the polyimide type, for example, 20 to 100 μm thick, is bonded to the top of lower electrode 20 by a heat-resistant adhesive of acryl type. This film 20a makes impedance impedance between wafer W and lower electrode 20 uniform.

Figure 6:
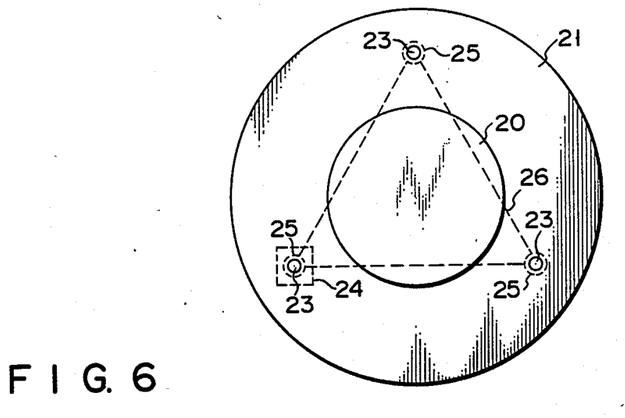
FIG. 6 shows a system for carrying a lower electrode of the etching device.

Lifter 19 is located under process chamber 12 and connected to lower electrode 20 to move it up and down. Lifter 19 includes motor 24 for moving lower electrode up and down, disk-like support 90 fixed to the bottom of process chamber 12 and serving to support motor 24, three ball screws 23 connecting support 90 to the bottom of process chamber 12, and nuts screwed onto ball screws 23 and fixed to support plate 21. One of ball screws 23 is connected to motor 24. When motor 24 is driven, this ball screw is rotated to move lower electrode 20 up and down through the following system. Sprocket 25 is fixed to each of the ball screws at a same level. Sprockets 25 are connected to one another by chain 26, as shown in FIG. 6. Three ball screws 23 are thus rotated synchronous with one another. When motor 24 is driven, therefore, lower electrode 20 connected to nuts 22 by support plate 21 is moved up and down with stability. Since three ball screws 23 are provided, levelness of electrode 20 can be adjusted easily.

Lower electrode 20 and the bottom of process chamber 12 are connected by bellows 27 made of, for example, stainless steel, which is a material preferable from the viewpoint of shielding dust. Process chamber 12 can be thus kept air-tight even when lower electrode 20 is being moved up and down by lifter 19.

Space 93 is formed within lower electrode 20, and four through-holes (only two of them seen in FIG. 5) 94 extend upward from space 93. Lifting plate 95 is arranged, movable up and down, in space 93. Four lifter pins 28, made of stainless steel and using to support wafer W, are fixed onto the top of lifting plate 95, passing through their corresponding through-holes 94. Lifter 30 is located under lower electrode 20 and lifting plate 95 is connected to lifter 30 through rod 96. When lifter 30 is driven, lifting plate 95 is lifted so that wafer W on lifter pins 28 can be lifted. Coil spring 31, which extends between lifting plate 95 and lower electrode 20, urges lifting plate 95 downward. When lifter 30 is left inoperative, the top of each of lifter pins 28 is positioned lower than the upper surface of lower electrode 20.

Figure 7:
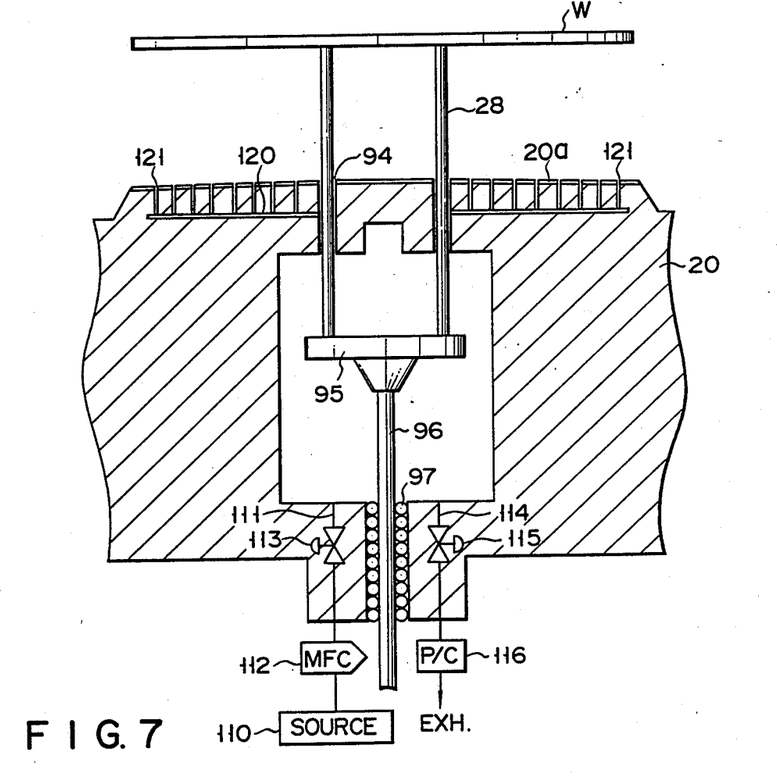
FIG. 7 is an enlarged view showing the main portion of the lower electrode.

As is shown in FIG. 7, pipe 111 extending from gas source 110 is connected to space 93 to supply He gas as cooling gas from gas source 110 to space 93. Flowmeter 112 and valve 113 are attached to gas supply pipe 111. Pipe 114 is also connected to space 93 and gas in space 93 is exhausted through this pipe 114. Pressure gage 116 and valve 115 are attached to exhaust pipe 114. Gas introducing passages 120 extend horizontal from through-holes 94, and sixteen vertical holes 121 extend upward from passages 120 to the top surface of lower electrode 20. During the etching process, cooling He gas supplied to space 93 is uniformly supplied to wafer W, passing through through-holes 94, passages 120 and vertical holes 121. Wafer W can be thus uniformly cooled to thereby enhance the uniformity of the etching conducted. Further, cooling liquid-passage 32 is formed in lower electrode 20. Cooling liquid such as mixture of antifreeze and water supplied from a source (not shown) is circulated through passage 32 to cool lower electrode 20, thereby enabling the uniformity of the etching process to be enhanced.

Clamp ring 36 is made of aluminium, for example, and its surface is anodized. Clamp ring 36 is located above lower electrode 20 and has fit portion 36 fitted onto the wafer supporting portion of lower electrode 20. Opening 36b having a diameter a little less than that of wafer W is formed at portion 36a. When etching is to be conducted, wafer W is positioned by clamp ring 36, such that wafer W corresponds to opening 36b of clamp ring 36.

Figure 9:
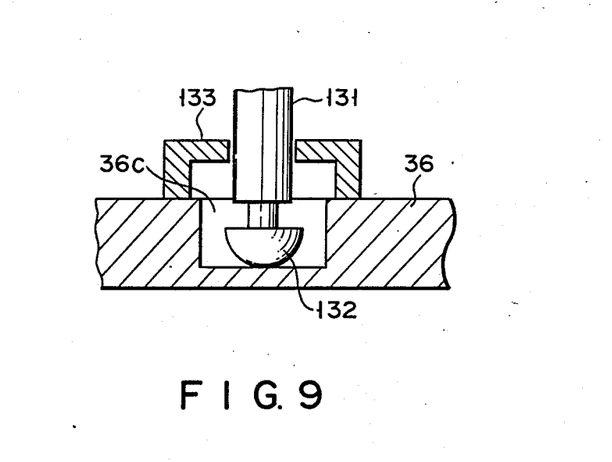
FIG. 9 is a sectional view showing the coupling of a clamp ring and a shaft in the etching device.

Pressure system 130 for adding push force to clamp ring 36 includes four shafts 11 made of high-purity alumina and used to support clamp ring 36, and four air cylinders 37 connected to shafts 131. As is shown in FIG. 9, distal ends 132 of shafts 131 are shaped like a hemisphere. Shafts 131 are coupled to clamp ring 36 by attachments 133, under the condition that distal end 132 of each of shafts 131 is contacted with the bottom of each of recesses 36c on clamp ring 36. Shafts 131 can be slightly tilted to clamp ring 36 in this case, because distal end 132 of each of shafts 131 is formed like a hemisphere. This enables clamp ring 36 to be positioned with high accuracy.

Upper electrode support 38 is located at the upper portion of process chamber 12, opposing to lower electrode 20. Upper electrode 40 made of, for example, amorphous carbon is supported to the lower surface of support 38 and they are electrically connected each other. Support 38 is made of conductive material such as aluminium, and its surface is anodized. Passage 39 is formed in support 38 and cooling liquid such as mixture of antifreeze and water supplied from a source (not shown) is circulated through passage 39 to cool support 38.

Space 41 is formed between support 38 and upper electrode 40, and gas is supplied into space 41 through gas supply line 140. More specifically, pipe 42 is connected to space 41 extends from space 41 to gas supply source 141 located outside process chamber 12. Flow rate adjuster (for example mass flow controller) 142 is attached to pipe 42. Reactive gas such as $CHF_3$ and $CF_4$, and carrier gas such as Ar and He are supplied from gas supply source 141 to space 41 via pipe 42.

Three baffles 43a, 43b and 43c are arranged in space 41 to diffuse reacting gases therein. Baffle 43a is located at the upper portion of space 41 into which reacting gases are introduced. Other baffles 43b and 43c are located at the middle portion of space 41. Each of the baffles has holes for allowing the passage of the gases, these holes are in a radial pattern. The holes of the baffle 43a have a diameter of 20 mm. The holes of baffle 43b have a diameter of 5 mm. The holes of baffle 43c have a diameter of 2 mm. The holes of baffles 43b are staggered from those of baffle 43a, and the holes of baffle 43c are also staggered from those of baffle 43b. Hence, the reacting gases can be efficiently diffused in space 41. Upper electrode 40 has through-holes 44. The reacting gases diffused trough the baffles are supplied into process chamber 12, passing through these holes 44.

Insulation ring 45 is attached to outer circumferences of support 38 and upper electrode 40. Shield ring 46 made of, for example, ethylene tetrafluoride, is further attached along the rim of upper electrode 40 as well as to the lower end of insulation ring 45. When upper electrode 40 is shielded by shield ring 46 along its rim, the exposed area of upper electrode, which serves to generated plasma is made substantially equal to the area of wafer W. Thus, plasma can be applied to that area of wafer W upon applying etching process to wafer W. High frequency power source 47 is connected to electrode 40 and high frequency current is applied from this power source 47 to between upper and lower electrodes 40 and 20 to generate plasma between them.

Exhaust ring 34 enclosing closely lower electrode 20 is fixed to the lower portion of the inner side wall of process chamber 12. Exhaust ring 34 has exhaust holes 33 through which gases are exhausted from process chamber 12. The diameter of each exhaust holes 33 is 5mm, for example. Thirty-six units of them are arranged at angle intervals of 10° in exhaust ring 34. Exhaust pipe 35 is connected to that portion of the wall of process chamber 12 which is under exhaust ring 34. Turbo molecular and rotary pumps 150 and 151 are connected to exhaust pipe 35. When these pumps 150 and 151 are rendered operative, process chamber 12 is exhausted.

Figure 10:
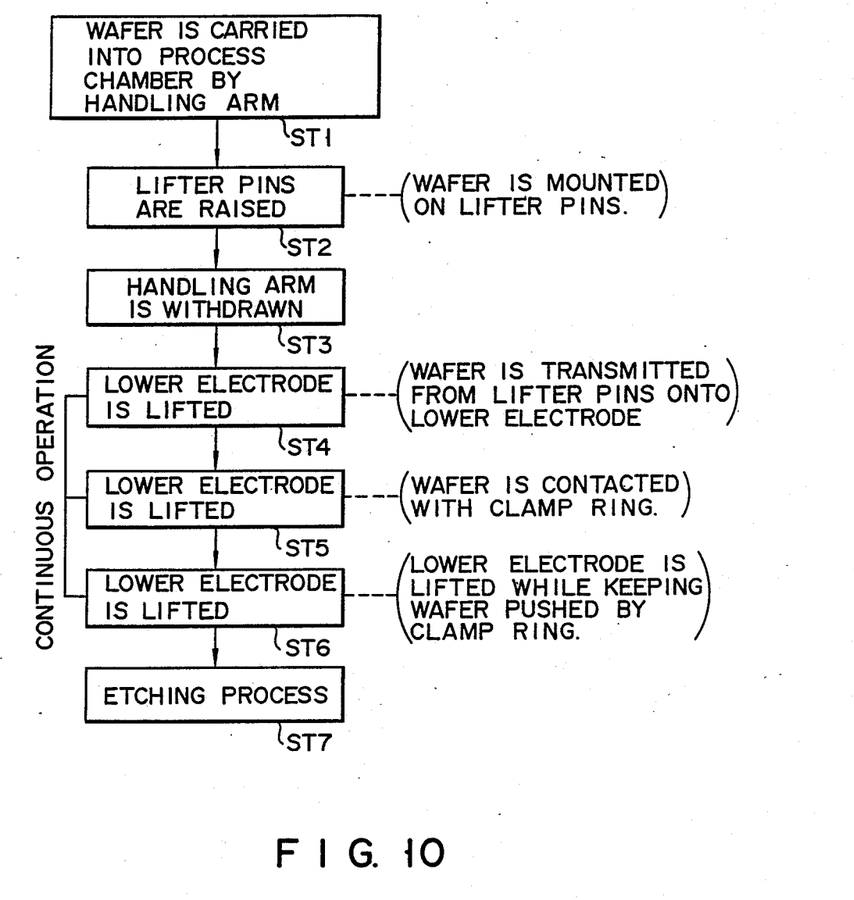
FIG. 10 is a flow chart showing an etching process.

The operation of the etching device having the above-described arrangement will be described with reference to FIG. 10.

Loading and unloading wafer cassettes 7 are set on two cassette stages 8 by an operator or robot hand. Twenty-five pieces of wafers W are placed in the loading wafer cassette, while the unloading cassette is left empty in this case. Wafer W to be loaded is set at a certain position by the lifter located under the cassette setting stage on which the loading wafer cassette has been set. Multi-joint robot 9 is positioned adjacent to the loading cassette. Arm 10 of multi-joint robot 9 is put under wafer W which is to be processed. Wafer W is vacuum-sucked onto arm 10 while slightly lowering cassette stage 8.

Arm 10, on which wafer W is held, is carried to alignment section 400 to transmit wafer W onto chuck 11 where wafer W is centered and orientation flat of wafer W is positioned. Inert gas such as $N_2$ is introduced onto load lock chamber 13 located at the intrance portion of process chamber 12, keeping chamber 13 pressurized. Opening/closing system 16a is opened while introducing gas $N_2$ into chamber 13. Wafer W which has been positioned is mounted on multi-joint arm 72 of handling device 70. Wafer W is then carried into load lock chamber 13 by handling device 70 and opening/closing system 16a is closed. Pressure in load lock chamber 13 is then reduced to 0.1 to 2 Torr, for example. Pressure in process chamber 12 is also reduced to $1 \times 10^{-4}$ Torr at this time.

Wafer W is carried into process chamber 12 by handling device 70, while leaving opening/closing system 16b of load lock chamber 13 open (Step 1). At this time, lifter pins 28 are lifted at a speed of 12mm/sec., for example, by means of lifter 30, passing through through-holes 94 of lower electrode 20 (Step 2). Wafer W is thus supported on the tops of four lifter pins 28.

After wafer W has been thus carried, multi-joint arm 72 of handling device 70 is withdrawn into load lock chamber 13, and system 16b is closed (Step 3).

Lower electrode 20 is lifted by lifter 19, and wafer W is mounted on lower electrode 20 (Step 4). Lower electrode 20 is further lifted at low speed and contacts clamp ring 36 (Step 5).

Lower electrode is further lifted 5mm, for example, while applying a certain pressure to clamp ring 36 through pressurizing system 130 (Step 6). Wafer W is thus sandwiched between lower electrode 20 and clamp ring 36, and is positioned. The top surface of lower electrode 20 is a little swelled like a dome, as described above. When wfer W is pushed against clamp ring 36, therefore, the center portion of wafer W is not projected downward, thereby enhancing the flatness of wafer W. In addition, the pressure applied to clamp ring 36 can be adjusted by the pressurizing system 130, thereby more enhancing the flatness of wafer W.

Lower electrode 20 are lifted and lowered by lifter 19 when lifter is driven by driving motor 24, as described above. When motor 24 is rotated, one of ball screws 23 connected to motor 24 is rotated, and sprocket 25 attached to this ball screw 23 is also rotated. Thus, chain 26 is driven, rotating other sprockets 25 at the same time and in the same direction. That is, all of three sprockets 25 rotate at the same time, and three ball screws 23 rotate synchronous with one another. Ball screws 23 are connected with support plate 21 by nuts 22. When three ball screws 23 rotate synchronizingly, support plate 21 is moved up and down keeping its previously-adjusted levelness. Lower electrode 20 can be moved up and down while the levelness of lower electrode 20 is kept fine.

Lower electrode 20 is lifted like this to set a gap of 6 to 20mm, for example, between lower and upper electrodes 20 and 40.

While this operation is being conducted, the exhaust of process chamber 12 is controlled by controller 601. It is confirmed at display section 604 whether process chamber 12 is under desired gas flow and exhaust pressure or not.

While controlling the exhaust gases from process chamber 12 so as to keep process chamber 12 at a pressure of 2 to 3 Torr, reaction gas such as $CHF_2$ and $CF_4$ and carrier gas such as He and Ar are supplied from gas supply source 141 to space 41 in upper electrode support 38 through gas supply pipe 42 at flow rates of 100SCCM and 1000SCCM, respectively. The reaction gas carried by carrier gas is uniformly diffused by baffles 43a, 43b and 43c in space 41. The reaction gas is then directed toward semiconductor wafer W, passing through through-holes 44 made in upper electrode 40.

While supplying the reaction gas in this manner, a high-frequency current having a frequency of 13.56MHz, for example, is applied from high frequency power source 47 to upper electrode 40 to force the reaction gas applied to wafer W, into plasma, thereby etching such as anisotropic etching being performed on wafer W (Step 7).

When high frequency current is added, upper electrode 40 and support 38 are heated to high temperatures. There is the risk that upper electrode 40 made of amorphous carbon is cracked because of difference in thermal expansion coefficients of upper electrode 40 and support 38. This risk is avoided, because upper electrode 40 is indirectly cooled by cooling liquid of antifreeze and water circulated through passage 39 in support 38. There is another risk that the resist pattern formed on the surface of wafer W is broken because lower electrode 20 is also heated to high temperature. This risk is avoided, because lower electrode 20 is cooled by cooling liquid circulated through passage 32 in it. The cooling liquid circulated is controlled to have a certain temperature ranging from 0° C. to 60° C., for example, so as to process wafer W under a certain temperature.

Wafer W is also heated to high temperatures by heat energy of plasma, while it is being etched. Nonetheless, it can be efficiently and uniformly cooled by cooling gas supplied through through-holes 94 and vertical holes 121, as described above. Wafer W is located closely to lower electrode 20; practically, a slight clearance due to fine irregularity of surfaces of both is made between wafer W and lower electrode. Cooling gas can be therefore supplied to all over wafer W through this slight clearance. Etching process is applied to wafer W, under this state, for a certain time period or 2 minutes, for example.

After etching process, lower electrode 0 is lowered and wafer W is mounted on lifter pins 28, while exhausting the gas in process chamber 12. Pressure in process chamber 12 is adjusted to be substantially same as that in load lock chamber 14 located at the out-side of chamber 12 and opening and closing system 18a is opened. Multi-joint arm 82 of handling means 80 is extended from load lock chamber 14 into process chamber 12 and put under wafer W. Lifter pins are lowered, and wafer W is attracted onto arm 82. Multi-joint arm 82 is then withdrawn into load lock chamber 14, and system 18a is closed. The pressure in auxiliary chamber 15 is reduced at this time to substantially same value as that of pressure in load lock chamber 14.

Opening/closing system 18b is then opened. Wafer W is carried onto a wafer stage (not shown) in auxiliary chamber 15 by means of multi-joint arm 82. Then, system 18b is closed, and the wafer setting stage is lowered. some predetermined processes, if necessary, are applied to wafer W in auxiliary chamber 15, thereafter, opening/closing system 15a is opened. Multi-joint robot 9 has been moved and now stays on the side of auxiliary chamber 15. Arm 10 of multi-joint robot 9 is extended into auxiliary chamber 15, and wafer W is sucked onto arm 10. Arm 10, on which wafer W is held, is withdrawn out of auxiliary chamber 15, and system 15a is closed. Multi-joint robot 9 is then rotated by 180°. Arm 10 is extended into empty cassette 7 to set wafer W at a predetermined position in cassette 7.

A sequence of the above-described operations is repeated until all of the wafers in loading cassette are picked up.

In the above-described etching device of the present invention, wherein an object to be processed or wafer is held between upper and lower electrodes and etched by plasma generated between the electrodes, the system for driving the lower electrode is located between that plane of the lower electrode in which the wafer is mounted. This can prevent wafers from being contaminated with dust generated caused by the drive system, thereby remarkably enhancing the yield of the etching process.

The wafer is held and positioned by the clamp ring. This enables the interval between the upper electrode and the wafer to be made constant. Therefore, uniform etching process can be applied to the wafers. Further, the top of the lower electrode, on which the wafer is mounted, is a little swelled like a dome. Hence, the wafer is inhibited from projecting downward when the wafer is held by the clamp ring. Furthermore, pressure can be applied to the clamp ring and adjusted by the pressurizing system when the wafer is held by the clamp ring. Therefore, the wafer can be held by the clamp ring, and the pressure applied to the clamp ring can be adjusted in accordance with the shape of the wafer to be etched. Still more uniform etching can be thus applied to the wafers.

It should be understood that the present invention is not limited to the above-described embodiment but can be variously modified. Although three ball screws acre rotated by the chain, synchronizing with one another, in the lifter for the lower electrode, rings made of rubber and ring-shaped sprockets may be used instead. The lower electrode are moved up and down by means of one motor in the above embodiment. Instead, it can be arranged such that a motor is connected to each of the three ball screws and that the ball screws are rotated synchronizing with one another. In short, it can be arranged to prevent the dust generated from adhering to objects to be processed, and to kept the lower electrode horizontal, while being moved up and down. The number of the ball screws is not limited to three but it may be more.

The object to be processed is not limited to wafers, but it can be LCD substrates used in the screen display device of the liquid crystal television.

Instead of four lifter pins three lifter pins or five or more lifter pins can used to transmit the object to be processes to the lower electrode.

The two electrodes used in the embodiment described above can be located, for example, vertically, opposing each other.

What is claimed is:

1. An etching device comprising:
   housing in which etching process is carried out;
   electrode means having first and second electrodes opposed to each other, for generating plasma between these electrodes while an object to be processed is being supported on the first electrode;
   drive means for driving said first electrode toward said second electrode;
   power-supplying means for applying a current between the first and second electrodes;
   holding means located between the first and second electrodes, for holding the object when said first electrode is moved, thereby pushing the object; and
   gas-supplying means for supplying reaction gases, which serve to etch the object, into a gap between the first and second electrodes.

2. The etching device according to claim 1, wherein said drive means has a drive unit located below that portion of said first electrode on which the wafer is supported.

3. The etching device according to claim 1, wherein said holder means has a holding member holding the rim portion of the object to be processed, and the object is held by the holding means and pushed against the holding member by the first electrode when the first electrode is moved by said moving means.

4. The etching device according to claim 3, wherein the top of said first electrode, on which the object to be processed is mounted, is swelled like a dome.

5. The etching device according to claim 4, further comprising pressing means for applying a certain pressure to said holder member to cause said folder member to hold the object.

6. The etching apparatus according to claim 1, wherein said first electrode is located above said second electrode, and said first electrode has an upper surface on which the object is supported.

7. The etching device according to claim 6, wherein said moving means includes at least three ball screws extending vertically, a member for supporting the lower electrode movable up and down along these screw balls, means for driving one of the screw balls, and means for causing all of the screw balls to be rotated, synchronizing with one another.

8. The etching device according to claim 7, wherein said synchronous means has sprockets attached to the ball screws at the same level, and a chain for connecting these sprockets to one another.

9. The etching device according to claim 1, wherein said electrode means has a electrode support for supporting said second electrode.

10. The etching device according to claim 9, wherein said electrode support has diffusing member for diffusing gases supplied from said gas supply means.

11. The etching device according to claim 10, wherein said gases diffusing member has plates having a plurality of holes through which gases pass.

12. The etching device according to claim 1, further comprising means for cooling said first electrode.

13. The etching device according to claim 1, further comprising means for cooling said second electrode.

14. The etching device according to claim 1, further comprising means for applying cooling gases to the object to cool it.

15. The etching device according to claim 14, wherein said object cooling means has a cooling gas source and a plurality of holes through which the cooling gases are applied to the object.

16. The etching device according to claim 1, further comprising means for evacuating the housing.

17. The etching apparatus according to claim 3, wherein said holding member is ring-shaped and having an inner surface tapered such that the cross section of said holding member narrows in the direction in which the object moves.

18. An etching device comprising:
a housing in which etching process is carried out;
electrode means having first and second electrodes opposed to each other, for generating plasma between these electrodes, while an object to be processed so being supported on said first electrode;
moving means located lower than the top of the lower electrode, for lifting and lowering the lower electrode up and down;
power-supplying means for applying current between these electrodes;
gas-supplying means for supplying reaction gases, which serve to generate plasma between the lower and upper electrodes; and
cooling means for applying reaction gases to the object and cooling it.

19. The etching device according to claim 18, wherein said cooling means has a cooling gas source and a plurality of holes through which the cooling gases are applied to the object.

20. A method of etching an object held between first and second electrodes, which plasma generated between these electrodes, said method comprising the steps of:
supporting the object on said first electrode;
moving said first electrode, thereby to push the object onto a holding member located between said first and second electrodes, whereby the object is held by said holding member; and
generating plasma between said first and second electrodes, while supplying reaction gases into a gap between said first and second electrodes, thereby etching the object.

21. The etching method according to claim 20, wherein said first electrode or said holding means is moved thereby to push the object onto the holding member, after said first electrode has been moved and abutted against said holding means.

22. The etching method according claim 20, wherein the object is loaded onto, or unloaded, from said first electrode, while being held at a position between said first electrode and said holding member and spaced from said first electrode.

* * * * *